(12) United States Patent
Bushnell et al.

(10) Patent No.: US 6,308,300 B1
(45) Date of Patent: Oct. 23, 2001

(54) TEST GENERATION FOR ANALOG CIRCUITS USING PARTITIONING AND INVERTED SYSTEM SIMULATION

(75) Inventors: Michael L. Bushnell, Princeton Junction; Rajesh Ramadoss, Piscataway, both of NJ (US)

(73) Assignee: Rutgers University, Piscataway, NJ (US)

( * ) Notice: Subject to any disclaimer, the term of this patent is extended or adjusted under 35 U.S.C. 154(b) by 0 days.

(21) Appl. No.: 09/326,516

(22) Filed: Jun. 4, 1999

(51) Int. Cl.[7] .............................. G06F 17/50; H01H 31/02
(52) U.S. Cl. ....................... 716/4; 716/7; 716/2; 324/537
(58) Field of Search .................................................. 716/4

(56) References Cited

U.S. PATENT DOCUMENTS

| | | | |
|---|---|---|---|
| 5,202,639 | * 4/1993 | McKeon et al. | 324/537 |
| 5,383,194 | * 1/1995 | Sloan et al. | 371/22.1 |
| 5,422,891 | * 6/1995 | Bushnell et al. | 371/22.4 |
| 5,831,437 | * 11/1998 | Ramadoss et al. | 324/537 |

OTHER PUBLICATIONS

J. Vlach et al., Simulation of Networks with Inconsistent Initial Condition, May 1993 IEEE International Symposium on Circuits and Systems, pp. 1627–1630.*
R. Ramadoss et al., Test Generation for Mixed Signal Devices using Signal Flow Graphs, Ninth International Conference on VLSI Design, pp. 242–248, Jan. 1996.*
N. Nagi et al., Drafts: Discretized Analog Circuit Fault Simulator, Proceedings of 30th International Conference of Design Automation, pp. 509–514, Jun. 1993.*
Bryant, R. "Mossim: A Switch–Level Simulator for MOS LSI" 18th Design Automation Converence, Paper 41.2, pp. 786–790, 1981.
Pillage, L. "Asymptotic Waveform Evaluation for Timing Analysis" IEEE Transactions on Computer–Aided Design, vol. 9, No. 4 pp. 352–366, Apr. 1990.
Duhamel, P. et al., "Automatic Test Generation Techniques for Analog Circuits and Systems: A Review" IEE Transactions on Circuits and Systems, vol. CAS–26, No. 7 pp. 411–440, Jul. 1979.
Nagi, N. et al., "Drafts: Discretized Analog Circuit Fault Simulator" 30th ACM/IEEE Design Automtion Conference, pp. 509–514, 1993.
Ho, C. et al. "The Modified Nodal Approach to Network Analysis" IEEE Transactions on Circuits and Systems, vol. CAS–22, No. 6, Jun. 1975.
Kaminska, B. et al., "Analog and Mixed–Signal Benchmark Circuits—First Release" International Test Conference, Paper 8.3, pp. 183–190, 1997.

* cited by examiner

Primary Examiner—Matthew Smith
Assistant Examiner—A. M. Thompson
(74) Attorney, Agent, or Firm—Mathews, Collins, Shepherd & Gould, P.A.

(57) ABSTRACT

The present invention relates to a method and apparatus for testing analog and mixed analog and digital circuits in which test waveforms are generated for testing the analog circuit. The analog circuit can be represented by a directed circuit graph. The directed circuit graph represents nodes of components of the circuit under test connected by directed edges for components having inputs or outputs which effect other components and undirected edges for components in the circuit that are bidirectional. For example, undirected edges are assigned to bidirectional elements such as resistors and capacitors and directed edges are assigned to transistors. The directed graph is partitioned into partitions that carry a signal from the primary inputs toward the primary outputs in the circuit under test. Feedback and local feedback are captured in a single partition. The partition of a faulty component is determined and the operating point of the partition is established to activate the fault. The fault effects on the transfer function of each partition are determined by fault sensitization and fault effect propagation.

21 Claims, 12 Drawing Sheets

BIPOLAR JUNCTION TRANSISTOR

MOS FIELD EFFECT TRANSISTOR

DIODE

TEST GENERATION FOR ANALOG CIRCUITS USING PARTITIONING AND INVERTED SYSTEM SIMULATION

This invention was made with government support under Grant Number F33615-96-1-5610-4309 of the Wright Laboratory Air Force Material Command, USAF. The Government has certain rights in this invention.

1. FIELD OF THE INVENTION

This invention relates to a method of testing analog and mixed analog /digital circuits in which the analog circuit defined as a directed circuit graph is partitioned and certain partitions between a circuit input and analog fault are inverted before being simulated in order to generate test waveforms which can be applied to the circuits to be tested.

2. DESCRIPTION OF THE RELATED ART

Mixed signal devices are being increasingly used for wireless communication, data acquisition and processing and other applications of analog and digital processing. The use of analog components within digital systems has necessitated testing of analog circuits to determine faults of the circuit. Accordingly, it has become a problem in the industry to test analog and mixed signal devices having analog and digital circuits.

Conventional solutions to testing of analog and mixed signal devices have been achieved by sensitivity analysis of models of the devices to be tested. Analog fault models of "catastrophic" faults on which there is a sudden and large deviation in a component value resulting in shorted and open circuits and "parametric" faults in which a component value varies with time or environment, causing potentially unacceptable deviations in the circuit behaviors have been described in Duhamel et al, *Automatic Test Generation Techniques for Analog Circuits and Systems: A Review*, IEEE Transactions on Circuits and Systems, Vol. CAS-26, No. 7: 411–440 July 1979. Analog test methods described include estimation methods, topological methods, taxonomical methods and linear system methods.

An analog circuit efficient fault simulation for mapping the circuit and circuit level faults to the discrete domain is described in Nagi et al. *Discretized Analog Fault Simulator* ACM/IEEE Design Automation Conference, pp. 592–599, June, 1993. Bilinear transformations map circuit equations into the Z domain. A first module performs a good circuit simulation while a second module processes the fault list and maps each fault into the discrete domain. A circuit description is given as input to a simulator. The simulator can use a simulation package, such as the simulation package with integrated circuit emphasis, SPICE. A preprocessor parses the input to extract connectivity information into an internal graph data structure. A transfer function is determined for each operational amplifier (op amp) block of the circuit. A signal flow graph is constructed and the transfer functions are used to obtain appropriate weights on the edges of the signal flow graph. Since the obtained signal flow graph may not be in the form that directly results in state equations, because the state equations are first order differential equations while the transfer functions can be second or higher order, the op amp faults are first modeled in the S-domain before mapping them to the Z-domain. The resulting equations are simulated for any given input. The above-described simulation approach has the drawback of defining the effect of the fault on the circuit outputs, but not defining the analog test pattern needed to test the circuit.

U.S. Pat. No. 5,831,437, issued to the inventors of this disclosure, describes a method and apparatus for generating test patterns to test analog or mixed circuits. A signal flow graph of the analog circuit is determined. The signal flow graph is inverted and reverse simulated with good and bad outputs to determine component tolerances of the circuit given circuit output tolerances. The inverted signal flow graph is backtraced from analog outputs to obtain analog input sinusoids which justify the analog outputs. This patent has the limitation of not being capable of testing for transistor faults.

It is desirable to provide a simplified method for test generation of analog and mixed signal devices, in particular for testing analog transistor faults.

SUMMARY OF THE INVENTION

The present invention relates to a method and apparatus for testing analog and mixed analog and digital circuits in which test waveforms are generated for testing the analog circuit. The analog circuit can be represented by a directed circuit graph. The directed circuit graph represents nodes of components of the circuit under test connected by directed edges for components having inputs or outputs which effect other components and undirected edges for components in the circuit that are bidirectional. For example, undirected edges are assigned to bidirectional elements such as resistors and capacitors and directed edges are assigned to transistors. The directed graph is partitioned into partitions that carry a signal from the primary inputs toward the primary outputs in the circuit under test. Feedback and local feedback are captured in a single partition. The partition of a faulty component is determined and the operating point of the partition is established to activate the fault. The fault effects on the transfer function of each partition are determined by fault sensitization and fault effect propagation.

In a preferred embodiment fault effects are obtained by determining system equations for each partition of the directed circuit graph. Preferably, for each partition having a faulty component or being between a circuit input and the faulty component, the analog system equations are partially inverted during simulation to invert inputs or outputs, thereby determining the analog waveform through simulation that is needed to produce a specified output waveform. Partitions after the partition including the faulty component are non-inverted in the simulation. Tolerances of the analog components can be defined in terms of the analog circuit output deviations with good and bad outputs of the circuit. Analog input test waveforms are obtained by simulating or solving the system equations. A good output is defined as an output within the voltage or current tolerance and a bad output is defined as an output that is outside the voltage or current tolerance. Input analog test waveforms are determined for the good output and bad output conditions and all node voltage and voltage source waveforms using transient waveform analysis. The generated input test waveforms can be applied to the analog circuit for testing the circuit. Monte Carlo analysis is preferably used during the simulation for determining a family of analog test waveforms throughout the analog circuit under test in the time domain. A Fast Fourier Transform is used to transform the analog test waveforms for good and bad outputs into the frequency domain. A determination is made from the sum of the frequency values of the good and bad test waveforms as to whether the sum value is within the tolerance for an analog circuit without a fault.

The present invention has the advantage of expeditiously and accurately testing analog circuits. Further, the method provides the capability of testing for DC transistor biasing faults, variations in transistor gain and variations in threshold voltages that determine switching of the device between operating nodes. DC transistor operating biasing faults mean that some transistor in the circuit is operating in the wrong mode which can lead to: non-linear responses of the faulty circuit when the good circuit would exhibit linear responses; excessive power consumption of the circuit; and clipping of the analog circuit output response. The method also provides the ability to compute component tolerances for analog circuits based on a particular analog test waveform and on deviation allowed at the analog circuit output.

The invention will be more fully described by reference to the following drawings.

DETAILED DESCRIPTION

Figure 1:
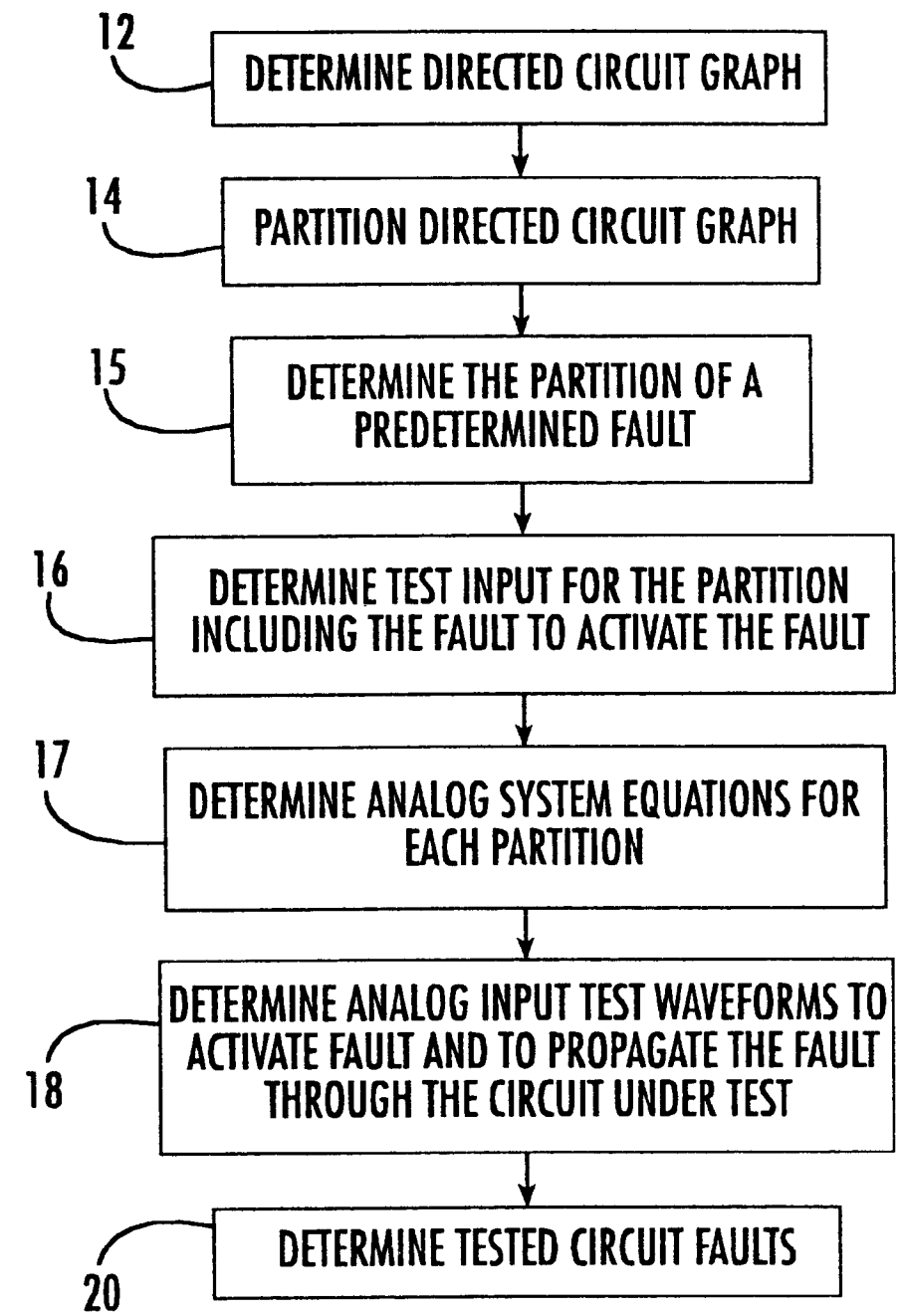
FIG. 1 is a flow diagram of a method for testing analog circuits in accordance with the teachings of the present invention.

FIG. 1 illustrates a flow diagram of a method for testing analog circuits 10 in accordance with the teachings of the present invention. In block 12, a circuit graph as a directed graph of the circuit under test is determined. The directed circuit graph represents all components of the circuit under test. The circuit under test can be an analog circuit, such as a cascaded non-linear analog circuit. Alternatively, the circuit can be a mixed analog and digital circuit. An edge in the directed circuit graph represents an input to a component or an output from a component. Directed edges are assigned in the directed circuit graph to components having inputs or outputs which effect other components in the circuit under test. For example, directed edges are assigned to transistor components in the circuit under test. Undirected edges are assigned in the directed circuit graph to components which have inputs or outputs that are bidirectional and the components influence each other. For example, undirected edges are assigned to bidirectional resistors and capacitors in the circuit under test.

In block 14, the directed circuit graph is partitioned into partitions representing connected components having signal carrying components and partitions representing connected components having non-signal carrying components. For example, non-signal carrying components include current mirrors and other bias elements such as components supplying current to the circuit under test.

For a predetermined fault in the circuit under test, the partition in the circuit graph including the faulty component is determined, in block 15. An output voltage tolerance $\Delta V$ of the analog circuit can be user-specified. A fault of a component of the analog circuit can be determined when at least one of the analog outputs is greater than the output voltage tolerance $\Delta V$. In block 16, a test input for the partition including the faulty component is determined to activate the fault in the partition including the faulty component. For example, the activation can be performed by supplying a voltage or current condition to the transistor in the partition including the faulty component to change the transistor among its operating modes, such as linear, saturation and cut-off. The test input can be used to test fault sensitization and fault effect propagation in the circuit under test.

In block 17, analog system equations are determined for all determined partitions of the directed circuit graph. Preferably, for each partition having a faulty component and each partition being between a circuit input and a faulty component, the analog system equations are partially inverted to invert certain inputs with certain outputs and certain outputs with certain inputs, thereby treating certain inputs as outputs and treating certain outputs as inputs for determining the analog waveform that is needed to produce a specified output waveform. Conventional analog system equations that are non-inverted are used for subsequent partitions between the partition having the faulty component and the circuit output since the partition including the faulty component produces known analog outputs and the subsequent partitions use the outputs of the partition including the faulty component, as described in more detail below.

In block 18, analog input test waveforms to activate desired analog output waveforms are determined from simulating or solving the analog system equations. In block 20, tested circuit faults are determined from the simulation results. For example a Fast Fourier Transform can be performed on the analog output waveforms and the results can be compared with known circuit values without faults.

Figure 2A:
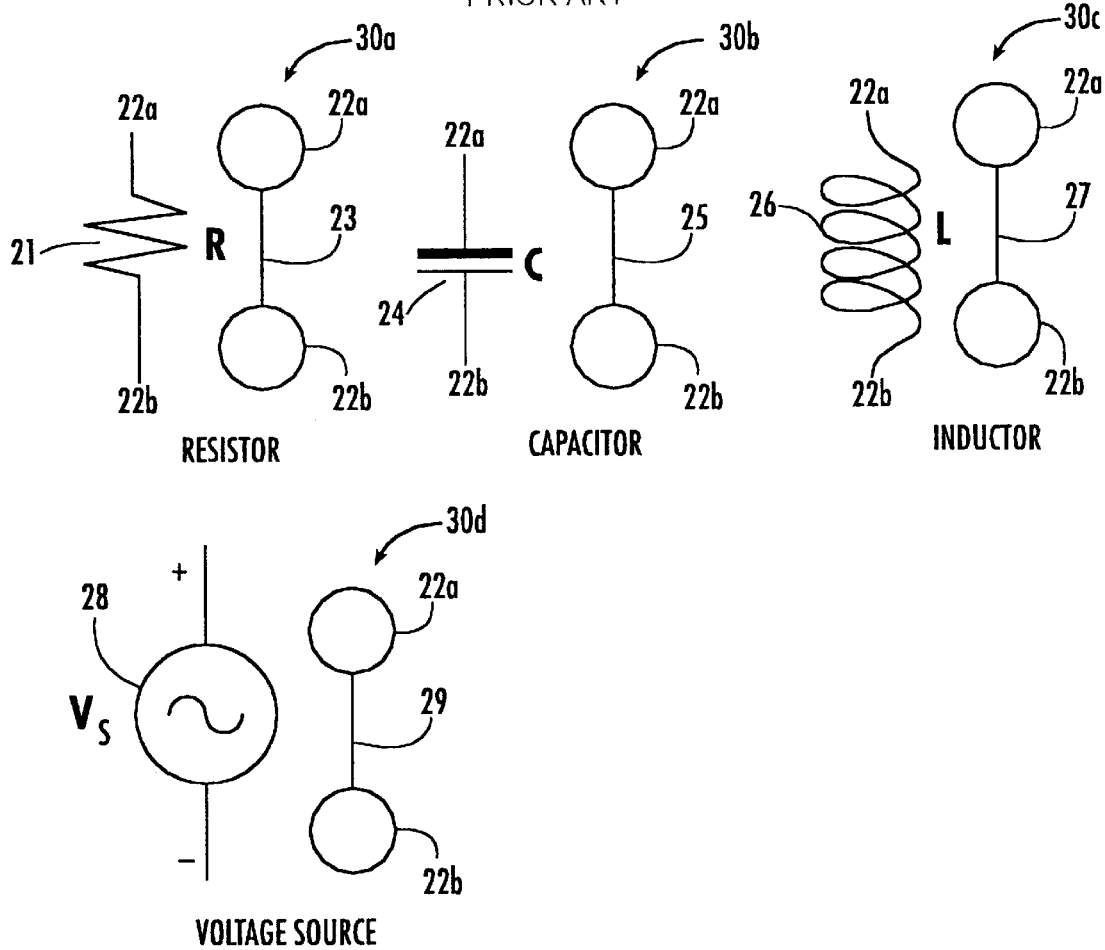
FIG. 2A is a schematic diagram of circuit components of a resistor, a capacitor and an inductor and respective directed circuit graphs.

FIGS. 2A–2E illustrate examples of analog circuit components represented in respective directed circuit graphs. Undirected edges are represented by lines and directed edges are represented by arrows in the directed circuit graph. A respective resistor 21, capacitor 24, inductor 26 or voltage source 28 is positioned between terminals 22a and 22b, as shown in FIG. 2A. In the respective directed circuit graphs 30a–30d representing resistor 21, capacitor 24, inductor 26 and voltage source 28, a respective undirected edge 23, 25, 27 or 29 is assigned between terminals 22a and 22b since terminals 22a and 22b in these circuit components can influence each other at all times.

Figures 2B, 2C, 2D, 2E:
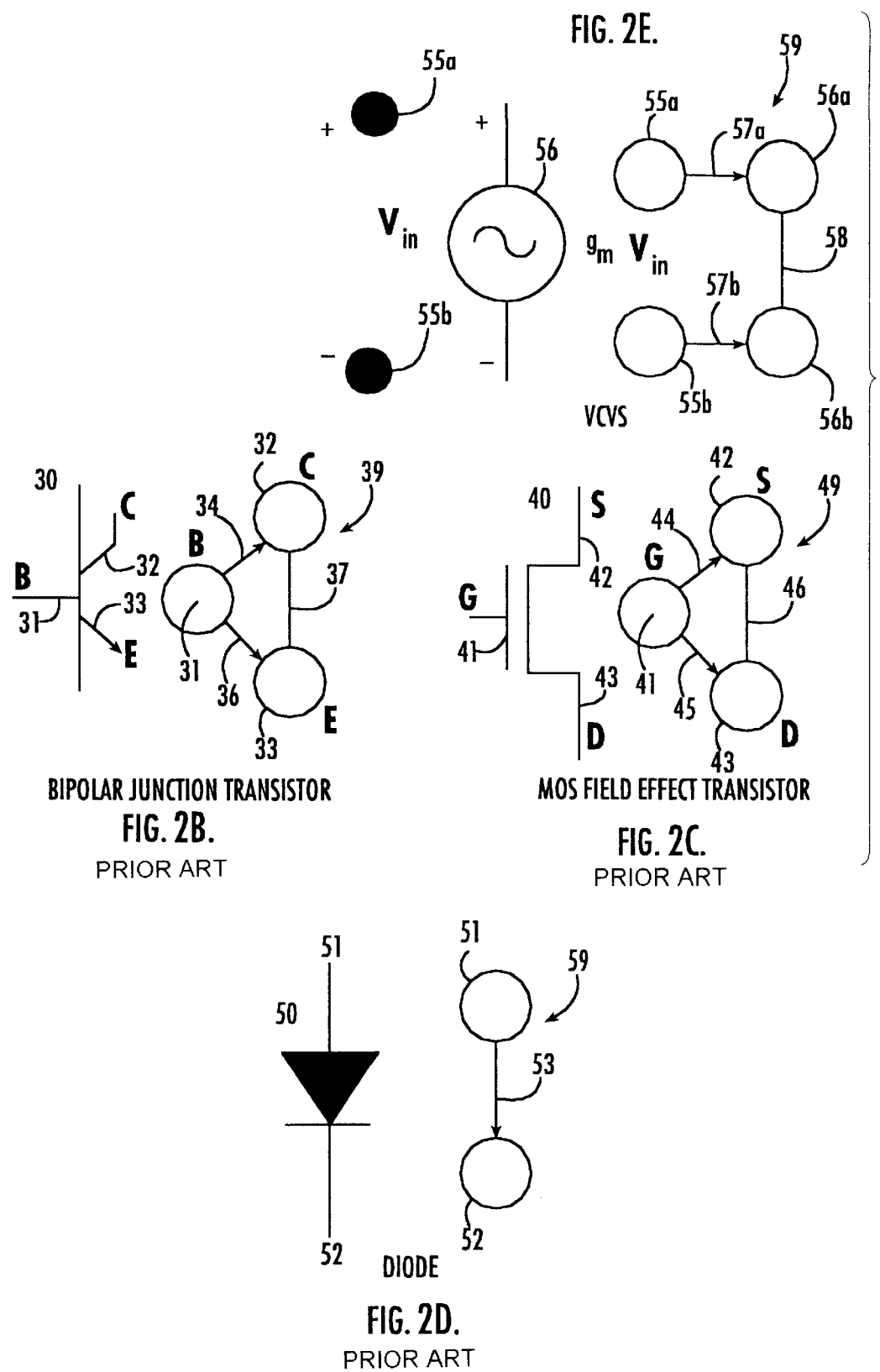
FIG. 2B is a schematic diagram of a NPN bipolar junction transistor and a representation of its directed circuit graph.
FIG. 2C is a schematic diagram of a MOS Field Effect Transistor and a representation of its directed circuit graph.
FIG. 2D is a schematic diagram of a diode and a representation of its directed circuit graph.

FIG. 2B illustrates NPN bipolar junction transistor 30 and its represented in directed circuit graph 39. NPN Bipolar junction transistor 30 includes base 31, collector 32 and emitter 33. In directed circuit graph 39, directed edge 34 is assigned from base 31 to collector 32. Directed edge 36 is assigned from base 31 to emitter 33. Undirected edge 37 is assigned between collector 32 and emitter 33 since voltages and currents at collector 32 and emitter 33 can influence each other. Directed circuit graph 39 is useful in forward active mode in which base 31 impacts collector 32 and emitter 33 and in cut off mode in which base 31, collector 32 and emitter 33 do not influence one another.

FIG. 2C illustrates MOS Field Effect Transistor (MOSFET) 40 represented in directed circuit graph 49. MOSFET 40 includes gate 41, source 42 and drain 43. Directed edge 44 is assigned between gate 41 and source 42. Directed edge 45 is assigned between gate 41 and drain 43. Undirected edge 46 is assigned between source 42 and drain 43 since each can influence the other.

FIG. 2D illustrates diode 50 represented in directed graph 54. Diode 50 includes p terminal 51 and n terminal 52. In directed circuit graph 54, directed edge 53 is assigned between p terminal 51 and n-terminal 52 to model behavior of diode 50 during forward biasing.

FIG. 2E illustrates a voltage controlled voltage source represented in directed circuit graph 59. Vin includes positive input 55a and negative input 55b. Voltage 56 is applied between positive input 55a and negative input 55b. For directed circuit graph 59 respective directed edge 57a and 57b are assigned between terminal 55a and terminal 56a and terminal 55b and terminal 56b. An undirected edge 58 is assigned between terminal 56a and terminal 56b. It will be appreciated that the teachings of the present invention can be used to determine directed circuit graphs of other conventional analog circuit components.

Figure 3A:
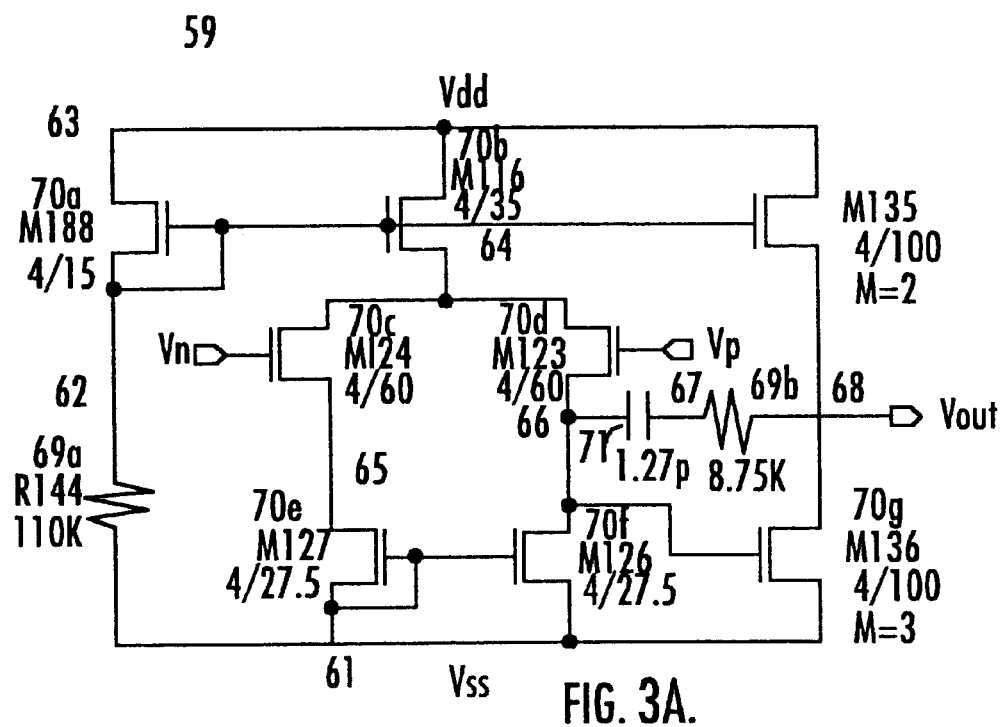
FIG. 3A is a schematic diagram of a CMOS compensated OP Amp benchmark circuit.

FIG. 3A illustrates a circuit diagram representative of a circuit under test 59 which is a CMOS compensated OP Amp benchmark circuit, as described in B. Kaminska and K. Arabi and I. Bell and P. Goteti and J. L.Huertas and B. Kim and A. Rueda and M. Soma, "Analog and Mixed-Signal Benchmark Circuits—First Release," in *Proceedings of the IEEE International Test Conference*, pp. 183–190, October 1997. Nodes 61–68 are assigned between components of circuit under test 59 having a common terminal. Node 61 is assigned between voltage source, Vss, and resistor 69a, representing resistor R144. Node 62 is assigned between resistor 69a and transistor 70a, representing transistor M188. Node 63 is assigned between transistor 70a and voltage supply Vdd. Node 64 is assigned between transistor 70b, representing M116, and transistor 70c, representing M124 and transistor 70d, representing M125. Node 65 is assigned between transistor 70c and transistor 70e, representing M127. Node 66 is assigned between transistor 70d, transistor 70f, representing M126 and capacitor 71. Node 67 is assigned between capacitor 71 and resistor 69b.

Figure 3B:
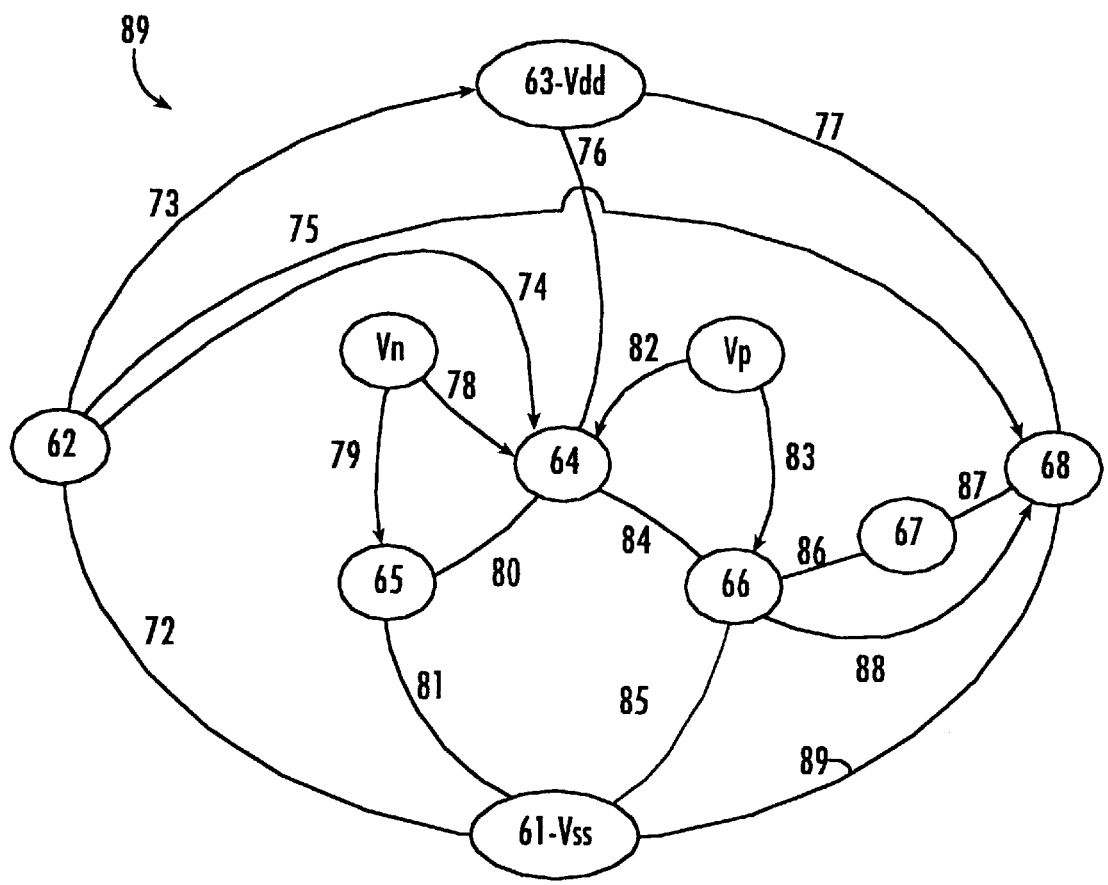
FIG. 3B is a directed circuit graph of the circuit shown in FIG. 3A.

FIG. 3B illustrates the directed circuit graph 60 of the circuit shown in FIG. 3A after performing block 12 to determine the directed circuit graph. A directed edge is assigned when a MOSFET gate influences a MOSFET source or a MOSFET drain node, when a bipolar transistor base influences a collector or an emitter, when a diode p terminal voltage influences a diode n terminal voltage, or when a node voltage unidirectionally influences a voltage in another node in a circuit. The latter case happens in a voltage-controlled voltage or current source. In the directed circuit graph, if there are both directed and undirected edges between two nodes, the directed edge is deleted. Undirected edge 72 is assigned between node 62 and node 61. Directed edges 73, 74 and 75 are assigned between node 62 and respective nodes 63, 64 and 68. It is noted that node 62 is gate shorted to node 64 resulting in directed edge 74. Undirected edge 76 is assigned between voltage Vdd and node 64. Undirected edge 77 is assigned between voltage Vdd and node 68. Directed edge 78 and directed edge 79 are assigned between voltage Vn and respective node 64 and node 65. Undirected edge 80 is assigned between node 64 and node 65. Undirected edge 81 is assigned between node 65 and node 61. Undirected edge 84 is assigned between node 64 and node 66 and undirected edge 85 is assigned between node 66 and node 61. Undirected edge 86 is assigned between node 66 and node 67 because of resistor 69b. Directed edge 88 from node 66 through transistor 70f is assigned to node 68. Undirected edge 89 is assigned from node 61 to node 68.

Figure 3C:
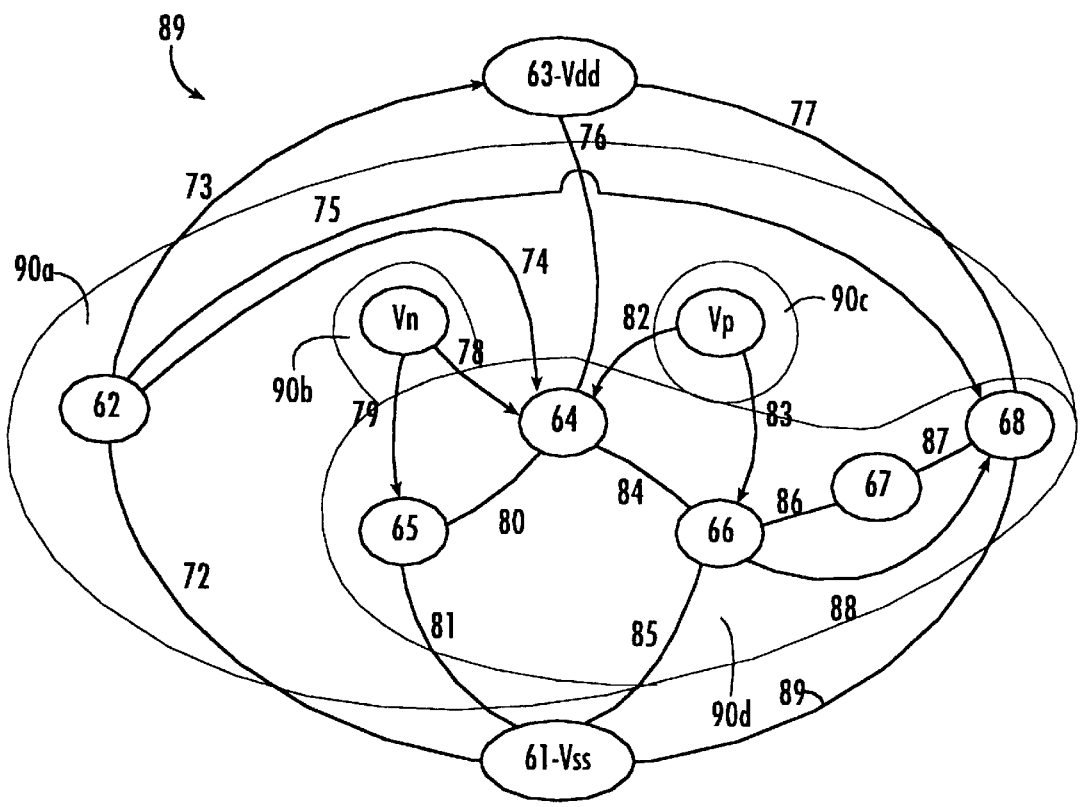
FIG. 3C illustrates partitioning of the directed circuit graph shown in FIG. 2B.

FIG. 3C illustrates the directed circuit graph shown in FIG. 3B after performing block 14 to partition the directed circuit graph. Partition boundaries are established for sets of directed edges as represented by dotted lines. Partition 90a is assigned to node 62 because node 62 has directed edges 75 and 74 therefor. Voltage Vn is assigned to partition 90b because voltage Vn has directed edges 78 and 79 therefrom. Voltage Vp is assigned to partition 90c because voltage Vp has directed edges 82 and 83 therefrom. Nodes 64, 65, 66, 67 and 68 are assigned to partition 90d because node 64 has directed edges 74, 78 and 82 thereto and nodes 66, 67 and 68 have respective undirected edges 84, 86 and 87. Thereafter, block 15 is performed to determine that a predetermined fault on node 62, representing the component labeled M188, is assigned to the partition labeled 90a in the directed circuit graph 89. Block 16 is performed to activate partition 90a for a fault and to determine a value for inputs $V_n$ from the partition labeled 90b and input $V_p$ from the partition labeled 90c to propagate the fault to output $V_{out}$.

Figure 4:
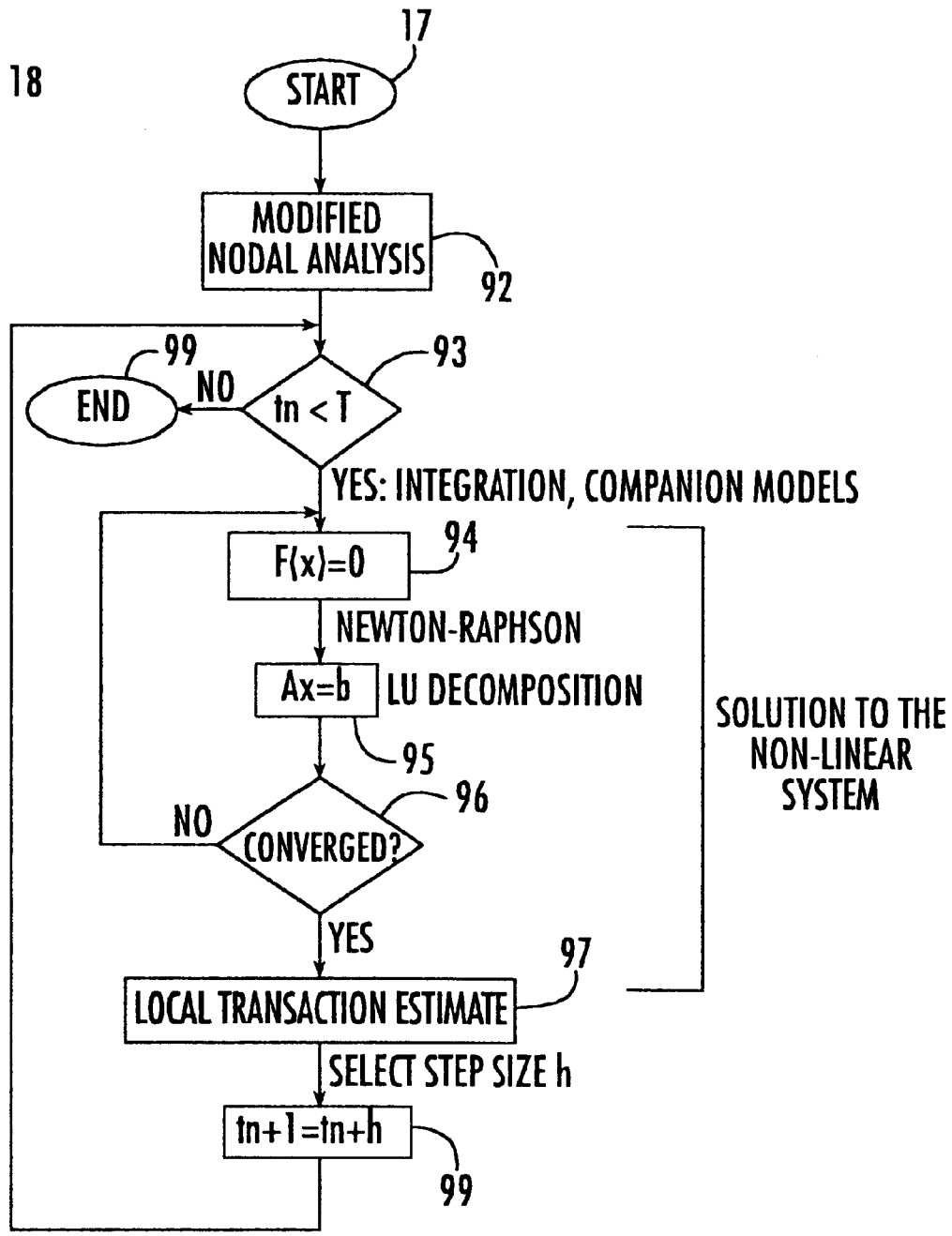
FIG. 4 is a flow diagram of a method for applying analog input test waveforms to the circuit under test with inverse simulation.

FIG. 4 illustrates an implementation of a block 18 by simulating the analog system equations determined in block 17 with a transient analysis using the Simulation Package with Integration Circuit Emphasis (SPICE) 90 as described in L. Nagel, *SPICE2: A Program to Simulate Semiconductor Circuits*. Ph.D. thesis, Department of Electrical Engineering and Computer Science, University of California, Berkeley, Calif., May 1975 and L. Pillage and R. Rohrer, "Asymptotic Waveform Evaluation for Timing Analysis," *IEEE Trans. on Computer-Aided Design*, vol. 9, pp. 352–366, April 1990, hereby incorporated by reference into this application. In block 92, the analog system equations are simulated with Modified Nodal Analysis (MNA), as described in C. W. Ho, A.E. Ruehli and P.A. Brennan, "The Modified Nodal Approach to Network Analysis," *IEEE Trans. on circuits and Systems*, vol. CAS-22, pp. 504–509, June 1975 hereby incorporated by reference into this application. Transient analysis is used to backwardjustify the analog input test waveforms at primary inputs of the circuit under test and check for propagation to primary outputs of the circuit under test. For example, if a desired value of one of the internal node voltages is known, the node voltage can be exchanged for one of the primary inputs and the primary input is solved and the output at the primary output is determined. The transient analysis is used in the time domain with variable time steps represented by the variable m. In block 93, a determination is made to determine if the time step $t_n$, is less than the testing time represented by variable T. In blocks, 94, 95, and 96 a solution is determined for the non-linear system representing the circuit under test. Preferably, a Newton-Raphson method is used for solving the equation $$F(X)=0$$

and solving the equation $$Ax=b$$

using piecewise linear models, wherein an unknown represented by x can be the node voltages and currents though voltage sources a and b includes primary input excitations and other components that depend of the circuit integration formula being used, such as companion models for capacitors and inductors. As an example the following system equations are defined in terms of independent variables $\{x_1, x\}$ for excitations $b_j$ in terms of unknown $x_i$.

$$a_{11}x_1 + a_{12}x_2 = b_1 \quad \begin{bmatrix} a_{11}a_{12} \\ a_{21}a_{22} \end{bmatrix}\begin{bmatrix} x_1 \\ x_2 \end{bmatrix} = \begin{bmatrix} b_1 \\ b_2 \end{bmatrix}$$

$$a_{21}x_1 + a_{22}x_2 = b_2$$

The system equations can be partially inverted for inverting predetermined partitions by defining $\{x_1, b_1\}$ as the set of independent variables and $\{x_2, b\}$ as the set of known resulting in the following equation $$a_{11}x_1 - b_1 = -a_{12}x_2 \quad \begin{bmatrix} a_{11}-1 \\ a_{21}0 \end{bmatrix}\begin{bmatrix} x_1 \\ b_1 \end{bmatrix} = \begin{bmatrix} -a_{12}x_2 \\ b_2 - a_{22}x_2 \end{bmatrix}$$

$$a_{21}x_1 - 0 \cdot b_1 = b_2 - a_{22}x_2$$

A modified system matrix $A^m$ and right hand side vector for swapping $x_i$ and $b_j$ are as follows $$a_{ki}^m = \begin{cases} -1, k = j \\ 0, k \neq j \end{cases};$$

$$b_k^m = \begin{cases} -a_{ji}x_i, k = j \\ b_k - a_{ki}x_i, k \neq j \end{cases}$$

Block 96 is executed to determine if the solution representing an analog input waveform has converged. If the solution is not converged, Blocks 94 and 95 are repeated until it is converged.

Block 97 is executed, after a solution to $A_x=b$ is determined, to provide a local truncation estimate. In block 98, the next step is defined from step size h as $$tn+1=tn+h$$

and blocks 93 through 96 are repeated until m is equal to T. Thereafter, block 99 is executed to end the SPICE simulation.

In a preferred embodiment, the transient analysis for all system equations using SPICE is solved with good output and bad output. Good output represents an output within the voltage tolerance and bad output represents an output which is outside the voltage tolerance. Alternatively, certain system equations representing partitions of the circuit under test which do not effect the model may not be solved.

Figure 5:
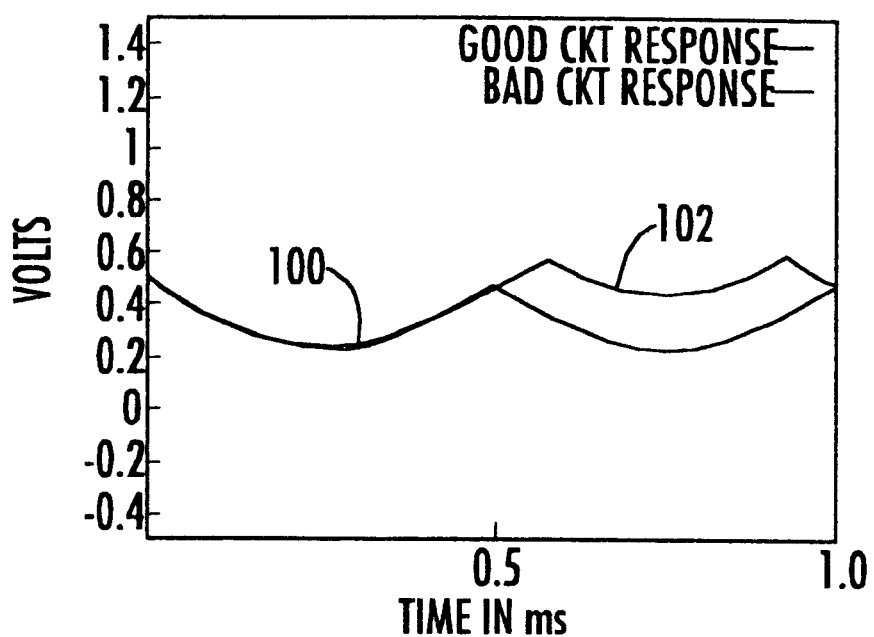
FIG. 5 is a graph of results for the circuit shown in FIG. 3A in the time domain.

The good output and bad output values can be determined using a DC and AC Monte Carlo analysis for randomly varying parameters of the circuit under test within conventional manufacturing limits, such as transistor widths and lengths. The Monte Carlo analysis is applied to good output within a determined good range and bad output values within a determined bad range. For example, parameters can be varied over an input range from −2.5V to about −0.5V for the CMOS compensated OP Amp benchmark circuit shown in FIG. 3A for producing the values in the time domain as shown in FIG. 5. The DC and AC Monte Carlo analyses was performed with variations of 2% in transistor widths and lengths for good output values. The DC and AC Monte Carlo analysis was performed with variations of 2% in transistor widths and lengths for bad output values including a 25% variations in transistor widths and lengths to test for single parameter faults. Curve 100 shows the time domain response for the CMOS OP Amp benchmark circuit simulated with good output. Curve 102 shows the time domain results for the CMOS OP Amp benchmark circuit simulated with bad output.

Figure 7A:
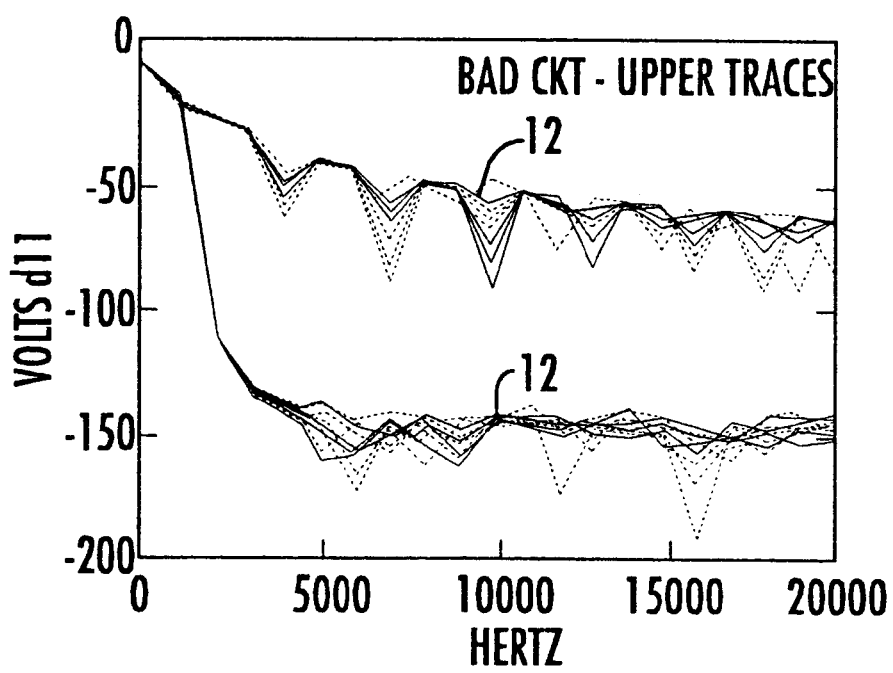
FIG. 7A is a graph of results for the circuit shown in FIG. 3A in the frequency domain.
Figure 6:
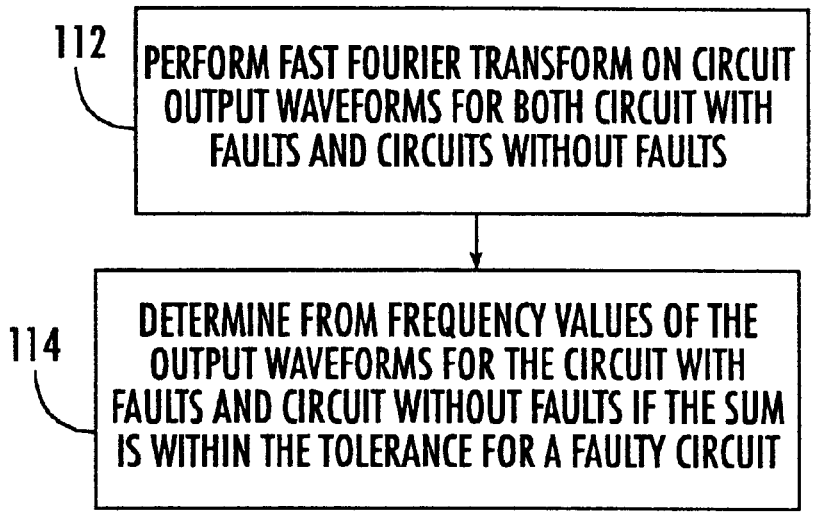
FIG. 6 is a flow diagram of an implementation for determining tested circuit faults.

FIG. 6 illustrates a flow diagram of an implementation of block 20 for determining tested circuit faults. In block 112, a fast Fourier Transform is performed on circuit output waveforms generated from the solution to the simulation in the time domain for good output and bad output values. For example, fast Fourier Transform of the system equations for the CMOS compensated OP Amp benchmark circuit represented in the time domain in FIG. 5 produces values in the frequency domain of the good circuit 120 and values in the frequency domain of a bad circuit 122 as shown in FIG. 7A.

Figure 7B:
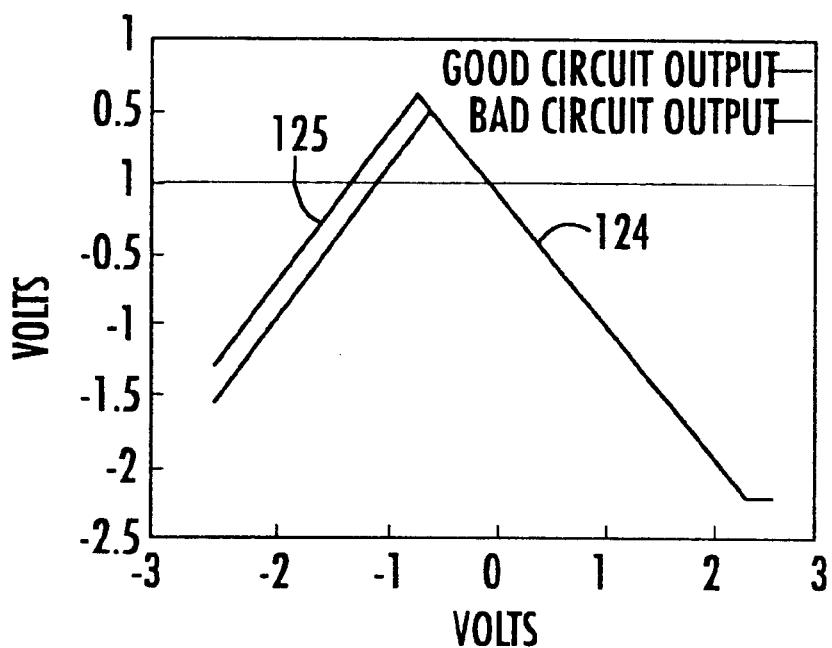
FIG. 7B is a graph of DC characteristics of the circuit shown in FIG. 3A.

In block 114, a determination is made from the sum of frequency values of the good circuit and the frequency values of the bad circuit if the sum value is within a predetermined tolerance for a circuit under test without a fault, thereby determining a good circuit. If the sum value is not within the predetermined tolerance for a circuit without a fault, a faulty circuit is determined. FIG. 7B illustrates a comparison of the DC transfer characteristics of a good circuit without a fault 124 and a bad circuit with a fault 125.

Figure 8A:
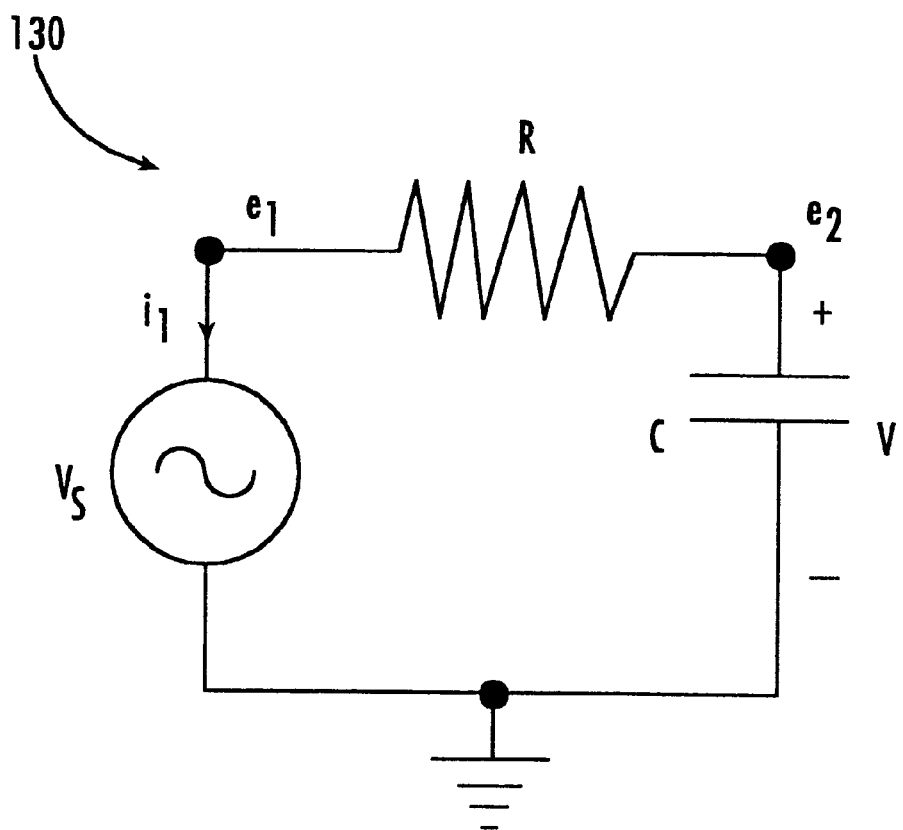
FIG. 8A is a schematic diagram of a RC circuit.

Alternatively, an implementation of block 18 is determined by simulating the system equations using a Backward-Euler approximation. FIG. 8A illustrates an RC circuit 130. $e_1$ represents current between the positive $v_s$ voltage source terminal and ground C. $e_2$ represents the voltage between the upper capacitor terminal and ground. $i_1$ represents the voltage in voltage source $v_s$. The following equation represents current, v across the capacitor, C, $$\left(v_{n+1} = v_{n+} \frac{h}{C}i_{n+1}\right)$$

with a time step $$h=t_{n+1}-t_n.$$

Accordingly, the system equations can be represented by $$\begin{bmatrix} \frac{1}{R} & -\frac{1}{R} & 1 \\ -\frac{1}{R} & \frac{1}{R}+\frac{C}{h} & 0 \\ 1 & 0 & 0 \end{bmatrix}\begin{bmatrix} e_1 \\ e_2 \\ i_1 \end{bmatrix}_{n+1} = \begin{bmatrix} 0 \\ \frac{C}{h}e_2 \\ V_s \end{bmatrix}_n$$

The equations may be partially inverted and written with $e_2$ as the known and $V_s$ as the unknown to result in the following representation $$\begin{bmatrix} \frac{1}{R} & 0 & 1 \\ -\frac{1}{R} & 0 & 0 \\ 1 & -1 & 0 \end{bmatrix}\begin{bmatrix} e_1 \\ V_s \\ i_1 \end{bmatrix}_{n+1} = \begin{bmatrix} \frac{1}{R}e_2 \\ -\left(\frac{1}{R}+\frac{C}{h}\right)e_2 \\ 0 \end{bmatrix}_{n+1} + \begin{bmatrix} 0 \\ \frac{C}{h}e_2 \\ 0 \end{bmatrix}_n$$

Figure 8B:
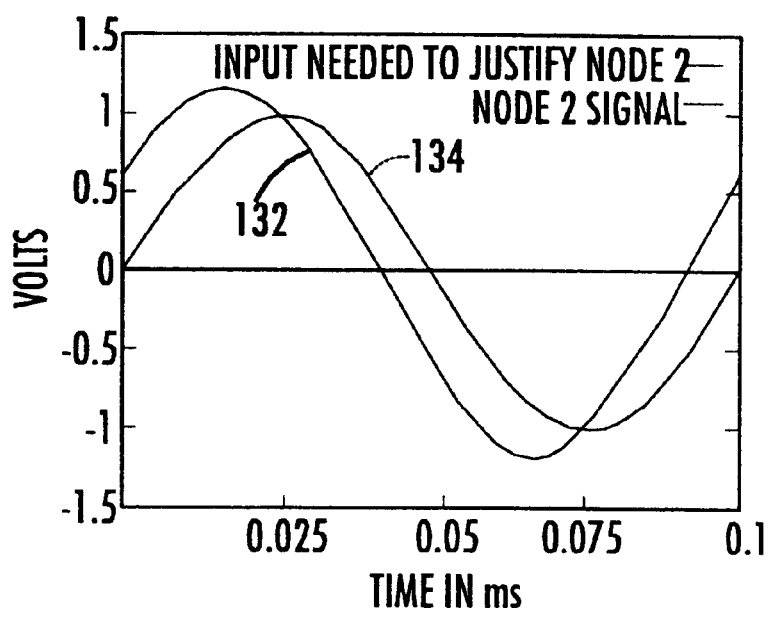
FIG. 8B is a graph of results of testing the RC circuit of FIG. 8A with the method of the present invention.

FIG. 8B illustrates results of a node signal 132, represented as a solid line, computed by system equation inversion, justifying signal 134 in RC circuit 130. Results of forward simulation of computed input $V_s$ 132, represented by the solid lines, agrees with original node signal 134. Alternatively, system equations can be simulated or solved with AWESIM, TK-Solver, MATLAB or any conventional simulator or equation solver.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. A method for testing faults in components of an analog circuit comprising the steps of:

defining a directed circuit graph having edges between nodes of the analog circuit;

partitioning the directed circuit graph into at least one partition of at least one of said nodes;

determining one of said nodes of said analog circuit as having a fault;

determining one of said at least one partitions which have said determined node having a fault;

determining test input for the determined partition including said node having a fault to activate said fault;

determining analog system equations for each of said at least one partitions;

determining analog input test waveforms by solving said system equations for activating desired output waveforms of said fault and for propagating said fault in said analog circuit; and determining faults of said circuit by comparing said output waveforms to output waveforms of known analog circuits without faults.

2. The method of claim 1 wherein a tolerance is determined for the analog circuit and said step of determining analog input test waveforms comprises the step of:

simulating each of said system equations with good signal output values representing an output within said tolerance and bad signal output values representing an output outside the tolerance for generating said analog input test waveforms as output analog test waveforms for a good circuit in the time domain and output analog test waveforms for a bad circuit in the time domain.

3. The method of claim 2 wherein said good signal output values are determined by randomly varying parameters of said analog circuit within a predetermined good range to provide a set of output analog test waveforms for a good circuit and said bad signal output values are determined by randomly varying parameters of said analog circuit within a predetermined bad range to provide a set of output analog test waveforms for a bad circuit.

4. The method of claim 3 wherein said step for determining faults of said circuit comprises:

performing a Fast Fourier Transform on said set of analog output test waveforms for a good circuit to generate values of said output analog test waveform for a good circuit in the frequency domain; and performing a Fast Fourier Transform on said output test waveforms for a bad circuit for generating a set of values of said output analog test waveform for a bad circuit in the frequency domain; and comparing a sum of the set of values of said output analog test waveform for a good circuit in the frequency domain and the set of values of said output analog test waveform for a bad circuit in the frequency domain with said tolerance.

5. The method of claim 4 wherein said simulating step is performed with a simulation package with integrated circuit emphasis.

6. The method of claim 4 wherein the simulation is performed with Backward-Euler approximation.

7. The method of claim 2 wherein said good output signal value, said bad output signal value and said tolerance is a voltage.

8. The method of claim 1 wherein the edges in said directed circuit graph are represented as a directed edge if the edge represents an input to said component of said analog circuit or an output from said component of said analog circuit and as an undirected edge if the edge represents a bidirectional input or output to said component of said analog circuit.

9. The method of claim 1 wherein said step of determining analog system equations further comprises the steps of:

partially inverting said system equations determined for said partition including said node having a fault; and partially inverting said system equation determined for said partition between an input to said analog circuit and said node having a fault.

10. The method of claim 1 wherein said partitions are determined as components having signal carrying components and partitions having no signal carrying components.

11. The method of claim 1 wherein one of said components in said analog circuit is a transistor.

12. The method of claim 11 wherein said test input is determined to change the transistor among operating modes of said analog circuit.

13. A system for testing faults in components of an analog circuit comprising the steps of:

means for defining a directed circuit graph having edges between nodes of the analog circuit;

means for partitioning the directed circuit graph into at least one partition of at least one of said nodes;

means for determining one of said nodes of said analog circuit as having a fault;

means for determining one of said at least one partitions which have said determined node having a fault;

means for determining test input for the determined partition including said node having a fault to activate said fault;

means for determining analog system equations for each of said at least one partitions;

means for determining analog input test waveforms by solving said system equations for activating desired output waveforms of said fault and for propagating said fault in said analog circuit; and means for determining faults of said circuit by comparing said output waveforms to output waveforms of known analog circuits without faults.

14. The system of claim 13 wherein a tolerance is determined for the analog circuit and the means for determining analog input test waveforms comprises:

means for simulating each of said system equations with good signal output values representing an output within said tolerance and bad signal output values representing an output outside the tolerance for generating said analog input test waveforms as output analog test waveforms for a good circuit in the time domain and output analog test waveforms for a bad circuit in the time domain.

15. The system of claim 14 wherein said good signal output values are determined by randomly varying parameters of said analog circuit within a predetermined good range to provide a set of output analog test waveforms for a good circuit and said bad signal output values are determined by randomly varying parameters of said analog circuit within a predetermined bad range to provide a set of output analog test waveforms for a bad circuit.

16. The system of claim 15 wherein said means for determining faults of said circuit comprises:

means for performing a Fast Fourier Transform on said set of analog output test waveforms for a good circuit to generate values of said output analog test waveform for a good circuit in the frequency domain; and means for performing a Fast Fourier Transform on said output test waveforms for a bad circuit for generating a set of values of said output analog test waveform for a bad circuit in the frequency domain; and means for comparing a sum of the set of values of said output analog test waveform for a good circuit in the frequency domain and the set of values of said output analog test waveform for a bad circuit in the frequency domain with said tolerance.

17. The system of claim 13 wherein the edges in said directed circuit graph are represented as a directed edge if the edge represents an input to said component of said analog circuit or an output from said component of said analog circuit and as an undirected edge if the edge represents a bidirectional input or output to said component of said analog circuit.

18. The system of claim 13 wherein said means for determining analog system equations further comprises the steps of:

means for partially inverting said system equations determined for said partition including said node having a fault; and means for partially inverting said system equation determined for said partition between an input to said analog circuit and said node having a fault.

19. The system of claim 13 wherein said partitions are determined as components having signal carrying components and partitions having no signal carrying components.

20. The system of claim 13 wherein one of said components in said analog circuit is a transistor.

21. The system of claim 13 wherein said test input is determined to change the transistor among its operating modes.

* * * * *